(12) United States Patent
She et al.

(10) Patent No.: US 10,712,005 B2
(45) Date of Patent: Jul. 14, 2020

(54) CERAMIC MATRIX COMPOSITE MANUFACTURING

(71) Applicant: GOODRICH CORPORATION, Charlotte, NC (US)

(72) Inventors: Ying She, East Hartford, CT (US); Naveen G. Menon, Anaheim, CA (US); Zissis A. Dardas, Worcester, MA (US); Thomas P. Filburn, Granby, CT (US)

(73) Assignee: GOODRICH CORPORATION, Charlotte, NC (US)

( * ) Notice: Subject to any disclaimer, the term of this patent is extended or adjusted under 35 U.S.C. 154(b) by 196 days.

(21) Appl. No.: 15/650,400

(22) Filed: Jul. 14, 2017

(65) Prior Publication Data

US 2019/0017704 A1     Jan. 17, 2019

(51) Int. Cl.

| | |
|---|---|
| *F23R 3/00* | (2006.01) |
| *C04B 35/80* | (2006.01) |
| *C04B 35/83* | (2006.01) |
| *C04B 35/565* | (2006.01) |
| *C23C 16/44* | (2006.01) |
| *C23C 16/04* | (2006.01) |
| *C23C 16/32* | (2006.01) |
| *C04B 111/00* | (2006.01) |

(52) U.S. Cl.
CPC ............ *F23R 3/007* (2013.01); *C04B 35/565* (2013.01); *C04B 35/806* (2013.01); *C04B 35/83* (2013.01); *C23C 16/045* (2013.01); *C23C 16/325* (2013.01); *C23C 16/4401* (2013.01); *C23C 16/4412* (2013.01); *C04B 2111/00362* (2013.01); *C04B 2235/46* (2013.01); *C04B 2235/5244* (2013.01);

(Continued)

(58) Field of Classification Search
CPC . F16D 2200/0047; C23C 16/22; C23C 16/44; C23C 16/4401; C23C 16/455
See application file for complete search history.

(56) References Cited

U.S. PATENT DOCUMENTS

| | | | | |
|---|---|---|---|---|
| 4,340,636 A | * | 7/1982 | DeBolt | .................. C04B 41/009 427/249.15 |
| 5,527,747 A | | 6/1996 | Lackey, Jr. | |

(Continued)

FOREIGN PATENT DOCUMENTS

JP     H03257167     11/1991

OTHER PUBLICATIONS

USPTO, Restriction/Election Requirement dated Jul. 13, 2018 in U.S. Appl. No. 15/709,338.

(Continued)

*Primary Examiner* — Kelly M Gambetta
(74) *Attorney, Agent, or Firm* — Snell & Wilmer L.L.P.

(57) ABSTRACT

A method of manufacturing a ceramic matrix composite component may include introducing a gaseous precursor into an inlet portion of a chamber that houses a porous preform and introducing a gaseous mitigation agent into an outlet portion of the chamber that is downstream of the inlet portion of the chamber. The gaseous precursor may include methyltrichlorosilane (MTS) and the gaseous mitigation agent may include hydrogen gas. The introduction of the gaseous precursor may result in densification of the porous preform(s) and the introduction of the gaseous mitigation agent may shift the reaction equilibrium to disfavor the formation of harmful and/or pyrophoric byproduct deposits, which can accumulate in an exhaust conduit 340 of the system.

9 Claims, 4 Drawing Sheets

(52) U.S. Cl.
CPC ............ *C04B 2235/614* (2013.01); *F16D 2200/0047* (2013.01); *F23M 2900/05004* (2013.01)

(56) References Cited

U.S. PATENT DOCUMENTS

| | | | |
|---|---|---|---|
| 5,609,721 | A | 3/1997 | Tsukune et al. |
| 5,738,908 | A * | 4/1998 | Rey ............... C04B 35/565 427/249.2 |
| 6,197,374 | B1 | 3/2001 | Huttinger et al. |
| 6,630,029 | B2 * | 10/2003 | Brun ............... C23C 16/455 118/715 |
| 2002/0006478 | A1 | 1/2002 | Yuda et al. |
| 2004/0050328 | A1 | 3/2004 | Kumagai et al. |
| 2005/0183666 | A1 | 8/2005 | Tsuji et al. |
| 2006/0060138 | A1 | 3/2006 | Keller |
| 2007/0272154 | A1 | 11/2007 | Amikura |
| 2011/0206585 | A1 | 8/2011 | Hara |
| 2015/0353371 | A1 | 12/2015 | Caton |
| 2016/0225619 | A1 * | 8/2016 | Ruda Y Witt ...... C23C 16/455 |
| 2016/0229758 | A1 * | 8/2016 | Kmetz ............. C04B 41/0018 |
| 2016/0297716 | A1 | 10/2016 | Nakamura et al. |
| 2016/0305015 | A1 | 10/2016 | Nakamura et al. |

OTHER PUBLICATIONS

USPTO, Non-Final Office Action dated Dec. 13, 2018 in U.S. Appl. No. 15/709,338.
European Patent Office, European Search Report dated Dec. 13, 2018 in Application No. 18183737.8.
Application as filed U.S. Appl. No. 15/709,338, filed Sep. 18, 2017 and entitled "Gas Distribution for Chemical Vapor Deposition/Infiltration."
USPTO, Final Office Action dated Mar. 14, 2019 in U.S. Appl. No. 15/709,338.
European Patent Office, European Search Report dated Feb. 19, 2019 18194913.2.
K. Brennfleck, et al.; In-situ-spectroscopic monitoring for SIC-CVD process control; Journal de Physique IV, 1999, pp. Pr8-1041-Pr8-1048.
J. Schlichting; Review 13 Chemical Vapor Deposition of Silicon Carbide; Powder Metallurgy International vol. 12, No. 3, 1980, pp. 141-147.
J. Schlichting; Review 13 Chemical Vapor Deposition of Silicon Carbide*; Powder Metallurgy International vol. 12, No. 4, 1980, pp. 196-200.
Weigang G. Zhang and Klaus J. Huttinger; CVD of SiC from Methyltrichlorosinae. Part II: Compositionof the Gas Phase and the Deposit**; Chem. Vap. Deposition 2001, 7, No. 4, pp. 173-181.
USPTO, Advisory Action dated May 23, 2019 in U.S. Appl. No. 15/709,338.
European Patent Office, European Search Report dated May 23, 2019 in Application No. 18194913.2.
USPTO, Notice of Allowance dated Aug. 14, 2019 in U.S. Appl. No. 15/709,338.
European Patent Office, European Search Report dated Aug. 21, 2019 in Application No. 18183737.8.

* cited by examiner

CERAMIC MATRIX COMPOSITE MANUFACTURING

FIELD

The present disclosure relates to composite manufacturing, and more specifically, to ceramic matrix composite manufacturing systems and methods that inhibit the formation of detrimental byproducts.

BACKGROUND

Carbon/carbon (C/C) composites are used in the aerospace industry for aircraft brake heat sink materials, among other applications. Silicon carbide (SiC) based ceramic matrix composites (CMCs) have found use as brake materials and other components in automotive and locomotive industries. These composites are typically produced using, for example, chemical vapor infiltration (CVI) or chemical vapor deposition (CVD). Such processes generally include placing porous preforms into a reactor and introducing a gaseous precursor to form silicon carbide depositions within the pores of the preform.

However, conventional infiltration and/or or deposition processes result in byproduct deposits accumulating within system components of the manufacturing system, such as the exhaust piping. The byproduct deposits may be reactive and even pyrophoric, and thus precautions are warranted to promote a safe manufacturing environment. For example, conventional manufacturing systems are often shut-down for periods of time while users manually clean the components and piping of the manufacturing system to remove the byproduct deposits. This cleaning procedure increases the downtime of the manufacturing system and thus decreases the capacity and throughput of conventional ceramic matrix composite manufacturing systems.

SUMMARY

In various embodiments, the present disclosure provides a method of manufacturing a ceramic matrix composite component. The method may include introducing a gaseous precursor into an inlet portion of a chamber that houses a porous preform and introducing a gaseous mitigation agent into an outlet portion of the chamber that is downstream of the inlet portion of the chamber. In various embodiments, the gaseous precursor includes methyltrichlorosilane (MTS) and the gaseous mitigation agent includes hydrogen gas. The gaseous precursor may be mixed with hydrogen gas.

In various embodiments, introducing the gaseous precursor is via a first stream (e.g., at a first molar flow rate) and introducing the gaseous mitigation agent is via a second stream (e.g., at a second molar flow rate). In various embodiments, the second molar flow rate is greater than the first molar flow rate. The second stream may have a greater flow rate than the gaseous precursor flow rate in the first stream. The second molar flow rate may be between 50% and 300% higher than the first gases precursor flow rate. In various embodiments, the second molar flow rate is between 100% and 200% higher than the gaseous precursor flow rate. In various embodiments, the first stream (e.g., the gaseous precursor) also includes hydrogen gas. In various embodiments, the methyltrichlorosilane constitutes about 5% of the gaseous precursor. In various embodiments, the gaseous mitigation agent is introduced into an upstream side of the outlet portion of the chamber.

Also disclosed herein, according to various embodiments, is a system of manufacturing a ceramic matrix composite component. The system may include a chamber having an inlet portion and an outlet portion. The inlet portion may be configured to house a porous preform. The system may also include a first inlet for introducing a gaseous precursor into the inlet portion of the chamber and a second inlet for introducing a gaseous mitigation agent into the outlet portion of the chamber. Still further, the system may include an exhaust conduit coupled in fluidic communication with the outlet portion of the chamber.

In various embodiments, the inlet portion includes retention spacers for retaining multiple, distributed porous preforms in place within the inlet portion of the chamber. The second inlet of the outlet portion may be disposed and configured to introduce the gaseous mitigation agent into an upstream side of the outlet portion of the chamber. The second inlet may be disposed in a side wall of the outlet portion of the chamber and/or the second inlet may include (i.e., may be supplied by) a conduit that extends through the first inlet and through the inlet portion of the chamber. In various embodiments, the outlet portion houses a gas mixing space which may include a gas mixing substrate. The gas mixing substrate may be volcanic rock or graphite, among other materials.

Also disclosed herein, according to various embodiments, is a chemical vapor deposition apparatus that includes a reactor furnace and an exhaust conduit. The reactor furnace may include an inlet portion and an outlet portion, wherein the inlet portion is configured to house a porous preform. The reactor furnace may also include a first inlet for introducing a gaseous precursor into the inlet portion of the reactor furnace and a second inlet for introducing a gaseous mitigation agent into the outlet portion of the reactor furnace. The exhaust conduit may be coupled in fluidic communication with the outlet portion of the reactor furnace.

In various embodiments, the chemical vapor deposition apparatus further includes a first supply conduit coupled to the first inlet and a first valve coupled to the first supply conduit to control flow of the gaseous precursor, wherein the gaseous precursor comprises methyltrichlorosilane (MTS). In various embodiments, the chemical vapor deposition apparatus further includes a second supply conduit coupled to the second inlet and a second valve coupled to the second supply conduit to control flow of the gaseous mitigation agent, wherein the gaseous mitigation agent comprises hydrogen gas.

The forgoing features and elements may be combined in various combinations without exclusivity, unless expressly indicated herein otherwise. These features and elements as well as the operation of the disclosed embodiments will become more apparent in light of the following description and accompanying drawings.

Figure 1A:
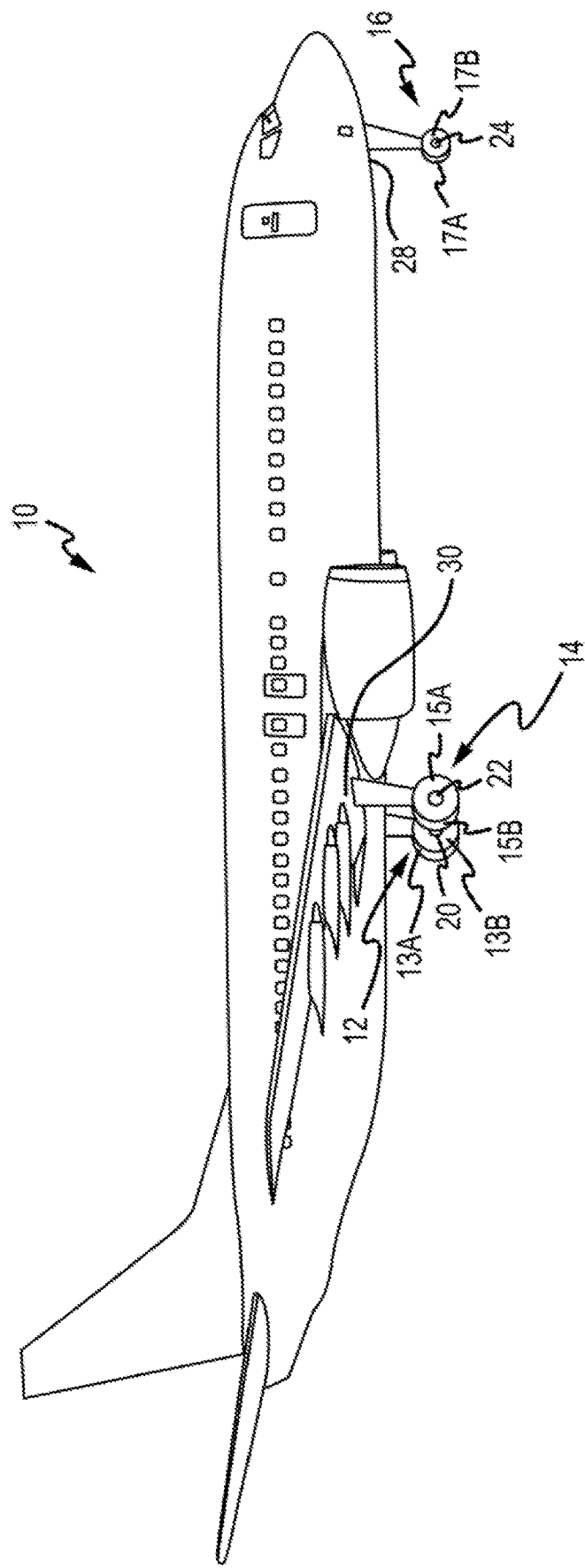
FIG. 1A illustrates an exemplary aircraft having a brake system, in accordance with various embodiments.

The subject matter of the present disclosure is particularly pointed out and distinctly claimed in the concluding portion of the specification. A more complete understanding of the present disclosure, however, may best be obtained by referring to the detailed description and claims when considered in connection with the drawing figures, wherein like numerals denote like elements.

DETAILED DESCRIPTION

The detailed description of exemplary embodiments herein makes reference to the accompanying drawings, which show exemplary embodiments by way of illustration. While these exemplary embodiments are described in sufficient detail to enable those skilled in the art to practice the disclosure, it should be understood that other embodiments may be realized and that logical changes and adaptations in design and construction may be made in accordance with this disclosure and the teachings herein without departing from the spirit and scope of the disclosure. Thus, the detailed description herein is presented for purposes of illustration only and not of limitation.

Provided herein, according to various embodiments, is a manufacturing system(s) and associated method(s) for fabricating ceramic matrix composite components while mitigating the formation and accumulation of harmful/hazardous byproduct deposits. While numerous details are included herein pertaining to aircraft components, such as brake components, the manufacturing system(s) and method(s) disclosed herein can be applied to fabricate other ceramic matrix composite components.

Referring now to FIG. 1A, in accordance with various embodiments, an aircraft 10 may include landing gear such as left main landing gear 12, right main landing gear 14 and nose landing gear 16. Left main landing gear 12, right main landing gear 14, and nose landing gear 16 may generally support aircraft 10 when aircraft 10 is not flying, allowing aircraft 10 to taxi, take off and land without damage. Left main landing gear 12 may include wheel 13A and wheel 13B coupled by an axle 20. Right main landing gear 14 may include wheel 15A and wheel 15B coupled by an axle 22. Nose landing gear 16 may include nose wheel 17A and nose wheel 17B coupled by an axle 24. In various embodiments, aircraft 10 may comprise any number of landing gears and each landing gear may comprise any number of wheels. Left main landing gear 12, right main landing gear 14, and nose landing gear 16 may each be retracted for flight. The landing gear may extend from an underside 28 of the fuselage or from an underside of the wings 30.

Aircraft 10 may also include a brake system which may be applied to a wheel of a landing gear. The brake system of aircraft 10 may comprise a collection of units, assemblies, and subsystems that produce output signals for controlling the braking force and/or torque applied at each wheel (e.g., wheel 13A, wheel 13B, wheel 15A, wheel 15B, etc.). The brake system may communicate with the brakes of each landing gear (e.g., left main landing gear 12, right main landing gear 14, and/or nose landing gear 16), and each brake may be mounted to each wheel to apply and release braking force on one or more wheels. The brakes of an aircraft 10 may include a non-rotatable wheel support, a wheel (e.g., wheel 13A, wheel 13B, wheel 15A, wheel 15B, wheel 17A, and/or wheel 17B) mounted to the wheel support for rotation, and a brake disk stack.

Figure 1B:
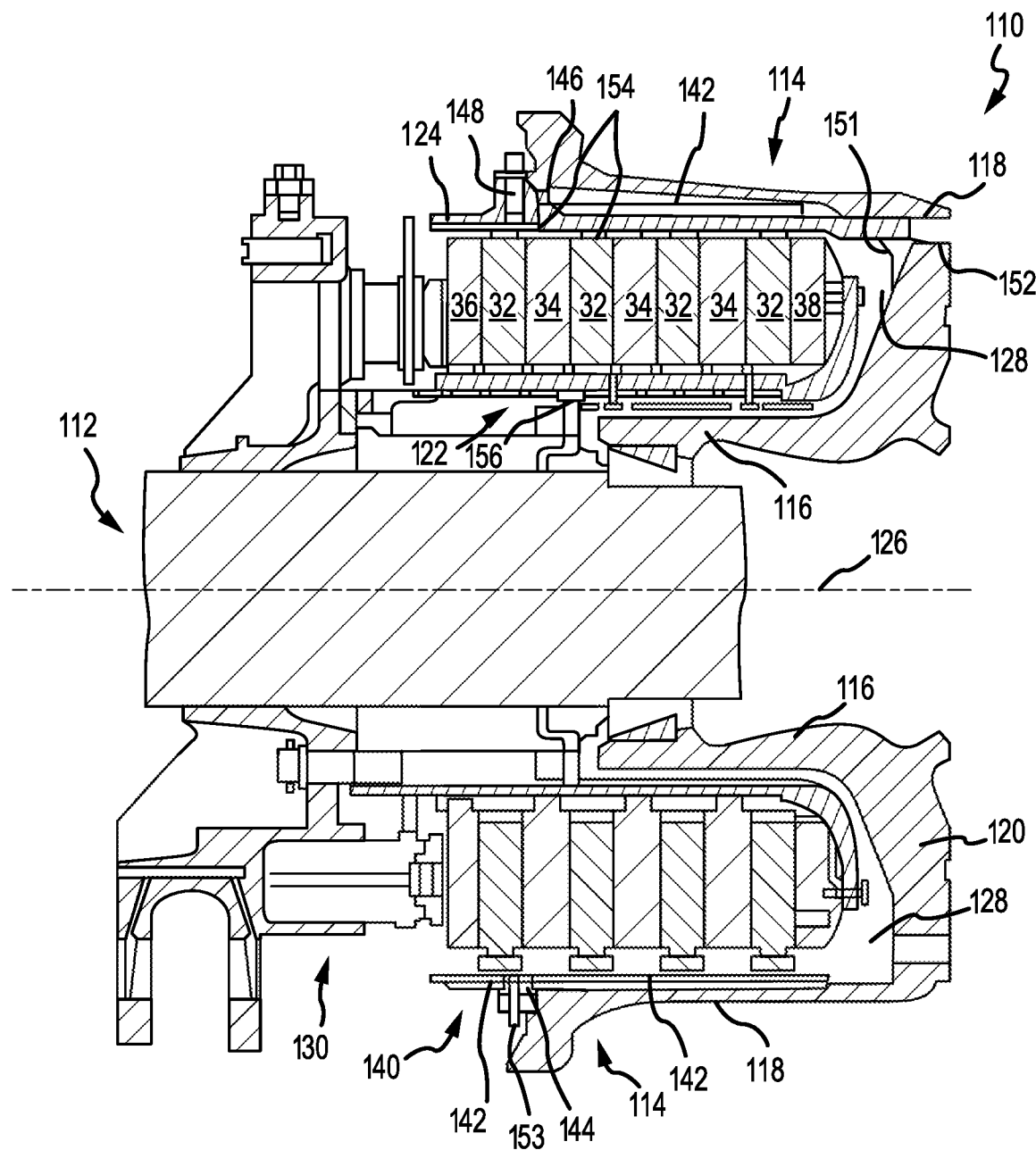
FIG. 1B illustrates a cross-sectional view of a brake assembly, in accordance with various embodiments.

Referring to FIG. 1B, brake assembly 110 may be found on an aircraft, in accordance with various embodiments. Brake assembly 110 may comprise a bogie axle 112, a wheel 114 including a hub 116 and a wheel well 118, a web 120, a torque take-out assembly 122, one or more torque bars 124, a wheel rotational axis 126, a wheel well recess 128, an actuator 130, multiple brake rotors 32, multiple brake stators 34, a pressure plate 36, an end plate 38, a heat shield 140, multiple heat shield sections 142, multiple heat shield carriers 144, an air gap 146, multiple torque bar bolts 148, a torque bar pin 151, a wheel web hole 152, multiple heat shield fasteners 153, multiple rotor lugs 154, and multiple stator slots 156.

Brake disks (e.g., interleaved rotors 32 and stators 34) are disposed in wheel well recess 128 of wheel well 118. Rotors 32 are secured to torque bars 124 for rotation with wheel 114, while stators 34 are engaged with torque take-out assembly 122. At least one actuator 130 is operable to compress interleaved rotors 32 and stators 34 for stopping the aircraft. In this example, actuator 130 is shown as a hydraulically actuated piston. Pressure plate 36 and end plate 38 are disposed at opposite ends of the interleaved rotors 32 and stators 34.

Through compression of interleaved rotors 32 and stators 34 between pressure plates 36 and end plate 38, the resulting frictional contact slows, stops, and/or prevents rotation of wheel 114. Torque take-out assembly 122 is secured to a stationary portion of the landing gear truck such as a bogie beam or other landing gear strut, such that torque take-out assembly 122 and stators 34 are prevented from rotating during braking of the aircraft. Rotors 32 and stators 34 may be fabricated from various materials, such as ceramic matrix composites. The brake disks may withstand and dissipate the heat generated from contact between the brake disks during braking.

Figure 2:
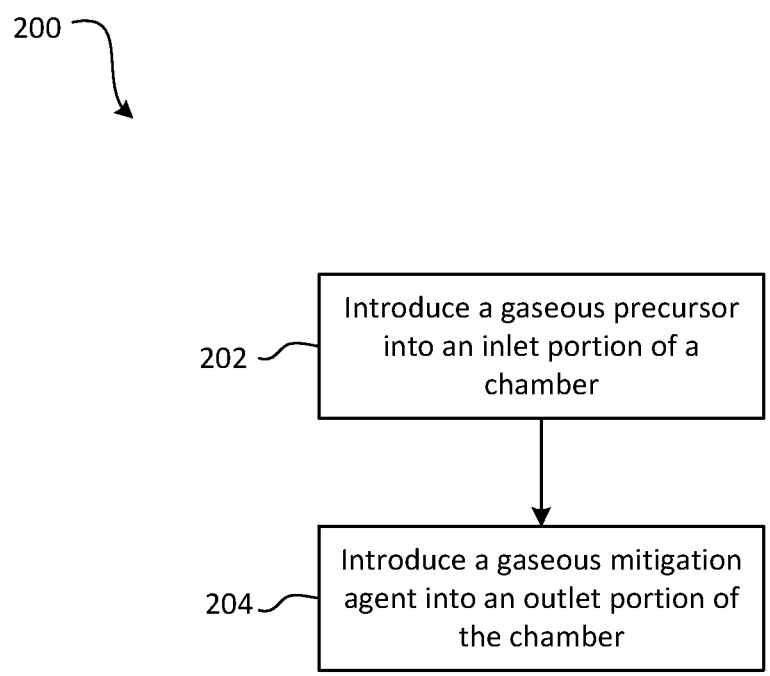
FIG. 2 is a schematic flow chart diagram of a method of manufacturing a ceramic matrix composite, in accordance with various embodiments.

In various embodiments, and with reference to FIG. 2, a method 200 of manufacturing a ceramic matrix composite component, such as a brake disk, is provided. The method 200 may include utilizing the manufacturing apparatus and manufacturing system 305 disclosed herein, as described in greater detail below with reference to FIG. 3. In various embodiments, and with reference to FIGS. 2 and 3, the method 200 includes introducing a gaseous precursor into an inlet portion 312 of a chamber 310 at step 202 and introducing a gaseous mitigation agent into an outlet portion 313 of the chamber 310 at step 204, according to various embodiments. One or more porous preforms 315, made from carbon or silicon carbide (SiC) fibers, may be loaded into the inlet portion 312 of the chamber 310, which may be a reactor furnace or other reaction compartment. Generally, the introduction of the gaseous precursor at step 202 results in densification of the porous preforms 315 and the introduction of the gaseous mitigation agent at step 204 shifts the reaction equilibrium to disfavor the formation of harmful and/or pyrophoric deposits, which can accumulate in the exhaust conduit 340 that is coupled in fluidic communication to the outlet portion of the chamber 310, as described in greater detail below.

The gaseous precursor may be introduced via a first inlet 320 into the inlet portion 312 of the chamber 310 and the gaseous mitigation agent may be introduced via a second inlet 330 into the outlet portion 313 of the chamber 310. In various embodiments, these two steps 202, 204 are performed simultaneously to fabricate ceramic matrix composite components. In other words, both the gaseous precursor and the gaseous mitigation agent may be flowing into the respective portions 312, 313 of the chamber 310 during fabrication. Accordingly, in various embodiments, the inlet portion 312 of the chamber 310 is upstream of the outlet portion 313 of the chamber 310.

In various embodiments, the gaseous precursor is introduced via the first inlet 320 at an inlet upstream side 311 of the inlet portion 312 of the chamber 310 and the gaseous mitigation agent is introduced via the second inlet 330 into an outlet upstream side 314 of the outlet portion 313 of the chamber 310. In various embodiments, because the gaseous mitigation agent is introduced into the outlet portion 313 of the chamber 310, the gaseous mitigation agent may not directly interact with the fibrous/porous preforms 315 and thus may not directly affect the reaction chemistry, as described below, in the inlet portion 312 of the chamber 310. Instead, the gaseous mitigation agent generally conditions the effluent gas flowing from the inlet portion 312 to inhibit and/or mitigate the formation of harmful byproduct deposits in the exhaust piping (e.g., exhaust conduit 340), according to various embodiments.

In various embodiments, the respective flow rates of gaseous precursor and gaseous mitigation agent are different. Introducing the gaseous precursor at step 202 is performed at a first flow rate (e.g., a first molar flow rate) and introducing the gaseous mitigation agent at step 204 is performed at a second flow rate (e.g., a second molar flow rate). In various embodiments, the second molar flow rate is between about 50% and about 300% higher than the gaseous precursor flow rate in the first stream. In various embodiments, the second molar flow rate is between about 100% and about 200% higher than the gaseous precursor flow rate in the first stream. In various embodiments, the method 200 includes controlling the temperature and pressure within pressurizing the chamber 310 to specific values. For example, the method 200 may include heating the chamber 310 to above 1,000 degrees Celsius and may include maintaining the chamber 310 at 10 torr (1.33 kilopascal).

The gaseous precursor includes, according to various embodiments, one or more reactants/reagents that react within the inlet portion 312 of the chamber 310 and infiltrate the pores of the porous preforms 315 to densify the porous preforms 315. For example, the gaseous precursor may include methyltrichlorosilane (MTS). The MTS may dissociate in response to being introduced via the first inlet 320 into the inlet portion 312 of the chamber 310 and, via various intermediate reactions, may result in SiC deposits forming in the pores of the porous preforms 315. Additional details pertaining to illustrative reactions that occur during the infiltration and deposition process are included below. The gaseous precursor stream may also include hydrogen gas, according to various embodiments. In various embodiments, the MTS constitutes about 5% of the gaseous precursor stream. In various embodiments, the gaseous mitigation agent is hydrogen gas.

In various embodiments, the reaction pathway that occurs within the chamber 310, with MTS and hydrogen gas constituting the gaseous precursor and with hydrogen gas constituting the gaseous mitigation agent, includes the following reactions:

$$CH_3SiCl_3 \rightarrow \cdot SiCl_3 + \cdot CH_3 \quad \text{Equation (1)}$$

$$\cdot SiCl_3 + \cdot CH_3 \rightarrow SiC + 3HCl \quad \text{Equation (2)}$$

$$\cdot CH_3 + H_2 \rightarrow CH_4 + \cdot H \quad \text{Equation (3)}$$

$$\cdot SiCl_3 + CH_3SiCl_3 \rightarrow HSiCl_3 + Cl_3SiCH_2 \cdot \quad \text{Equation (4)}$$

$$CH_3SiCl_3 \rightarrow Cl_2Si = CH_2 + HCl \quad \text{Equation (5)}$$

$$HSiCl_3 \rightarrow :SiCl_2 + HCl \quad \text{Equation (6)}$$

$$CH_3SiCl_3 \rightarrow ClCH_3 + :SiCl_2 \quad \text{Equation (7)}$$

$$:SiCl_2 + CH_4 \rightarrow :ClSiCH_3 + HCl \quad \text{Equation (8)}$$

$$ClCH_3 + H_2 \rightarrow CH_4 + HCl \quad \text{Equation (9)}$$

As mentioned above, the gaseous mitigation agent introduced at step 204 of the method 200 interacts with the effluent from the inlet portion 312 of the chamber 310 (i.e., interacts with the gaseous stream exiting the inlet portion 312 after passing over and through the porous preforms 315). In various embodiments, the gaseous mitigation agent shifts the reaction equilibrium of the above listed equations to disfavor the formation of harmful and/or pyrophoric deposits in the exhaust conduit 340. That is, the gaseous mitigation agent alters the stoichiometric ratios of the various/intermediate reactions to mitigate the formation of harmful byproducts which can accumulate within the exhaust conduit 340 of the system 305.

In various embodiments, the harmful byproduct deposits that conventionally form in the exhaust conduit are, for example, polychlorosilanes and cyclic carbosilanes that result from the free radicals and double bonded intermediate species produced in the equations above. Said differently, by using hydrogen gas as the gaseous mitigation agent, the "extra" hydrogen gas introduced at step 204 into the outlet portion 313 of the chamber 310 may drive production of HCl via Equation (9), and which may shift the reaction equilibrium to disfavor the formation of the free radical and double bond intermediate species formed in Equations (5), (6), and (8).

While numerous details are included herein pertaining specifically to using MTS as the gaseous precursor and hydrogen gas as the gaseous mitigation agent, other compounds may be utilized. For example, in various embodiments, the gaseous precursor may be dimethyldichlorosilane or trimethylchlorosilane, among others. In various embodiments, the gaseous mitigation agent may include water vapor, $NH_3$ gas, $BCl_3$ gas, or air, among others.

Figure 3:
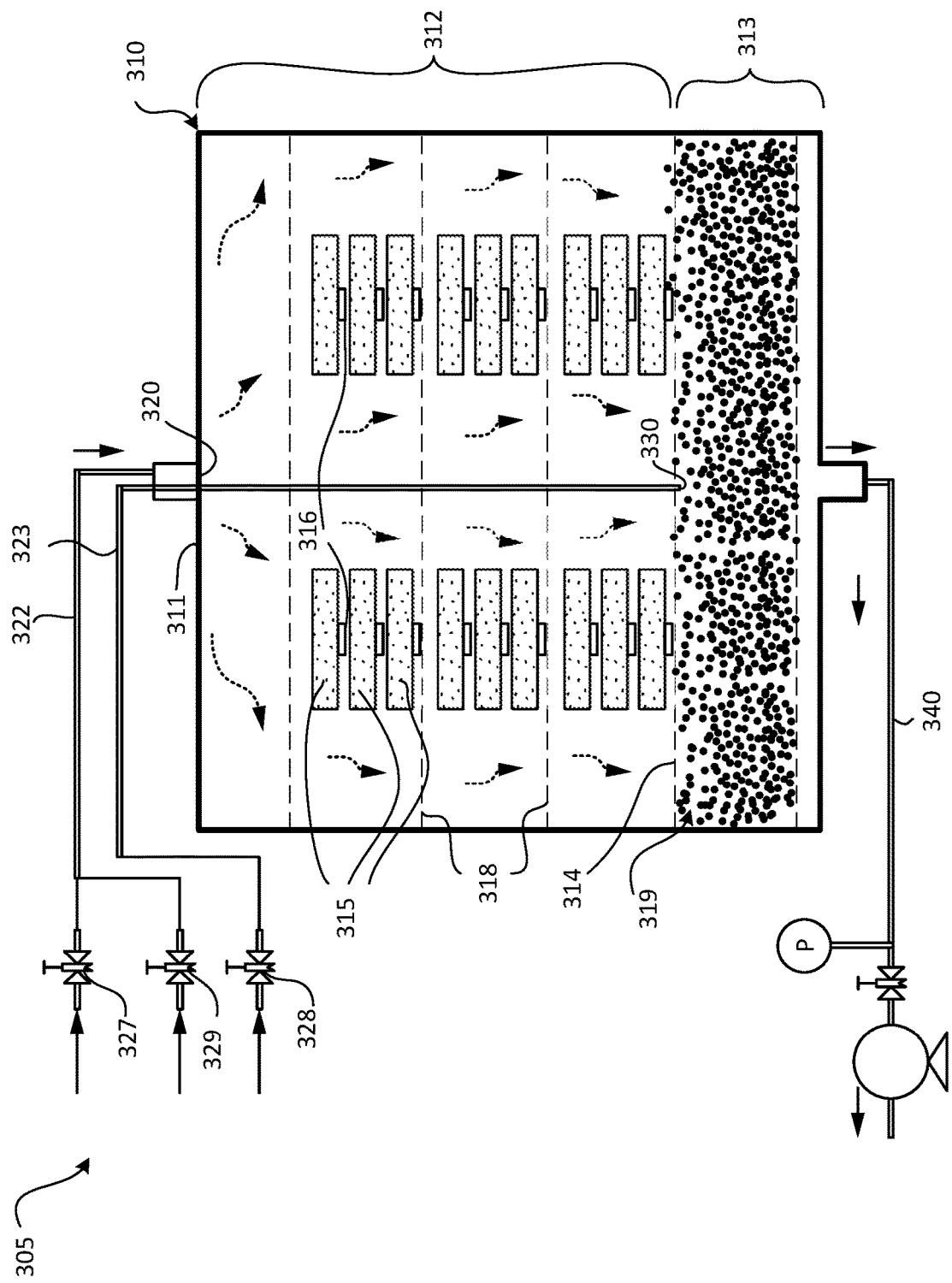
FIG. 3 is a schematic view of a ceramic matrix composite manufacturing system, in accordance with various embodiments.

In various embodiments, and with reference to FIG. 3, the system 305, which may be a chemical vapor deposition apparatus, may include a first supply conduit 322 and a second supply conduit 323. The first supply conduit 322 may deliver the gaseous precursor from a source to the inlet portion 312 of the chamber 310 via the first inlet 320. The second supply conduit 323 may deliver the gaseous mitigation agent from a source to the outlet portion 313 of the chamber 310 via the second inlet 330. A first valve 327 may be coupled to the first supply conduit 322 to control flow of the gaseous precursor and a second valve 328 may be coupled to the second supply conduit 323 to control flow of the gaseous mitigation agent. In various embodiments, the system 305 may also include a purge valve 329 that is configured to control flow of a purge gas, through one or both of the first and second supply conduits 322, 323, into the chamber 310 for purging the chamber after a completed CVD process.

In various embodiments, the second supply conduit 323 may extend into and through the inlet portion 312 of the chamber 310 to deliver the gaseous mitigation agent to the outlet portion 313 of the chamber 310. That is, the second inlet 330 may be an outlet end of the second supply conduit 323. In various embodiments, the second supply conduit 323 extends through the first inlet 320. For example, the second supply conduit 323 may extend into the chamber 310 so as to deliver the gaseous mitigation agent to a central, upstream section of the outlet portion 313 of the chamber 310. In various embodiments, the second inlet 330 is defined and disposed in a side wall of the chamber 310.

In various embodiments, the inlet portion 312 of the chamber 310 of the manufacturing system 305 may include one or more retention spacers 316 for retaining one or of the porous preforms 315. In various embodiments, the retention spacers 316 may facilitate distributing the porous preforms 315 throughout the inlet portion 312 of the chamber 310. The retention spacers 316 may be porous themselves, thus further allowing sufficient infiltration and deposition. In various embodiments, the chamber 310 may include one or more gas distributors 318 that facilitate the mixing and distribution of the gaseous precursor flowing through the housed porous preforms 315. The gas distributors 318 may also function to divide the inlet portion 312 into sub-compartments.

In various embodiments, the outlet portion 313 of the chamber 310 may define a gas mixing space 319 that may house a gas mixing substrate (e.g., a reaction sub-chamber). The gas mixing space 319 may facilitate mixing of the effluent gas from the inlet portion 312 with the gaseous mitigation agent introduced into the outlet portion 313 via the second inlet 330. The gas mixing space 319 may include a porous substrate. In various embodiments, the gas mixing space 319 may be loaded with a gas mixing substrate, such as volcanic rock or graphite, among other materials.

Benefits, other advantages, and solutions to problems have been described herein with regard to specific embodiments. Furthermore, the connecting lines shown in the various figures contained herein are intended to represent exemplary functional relationships and/or physical couplings between the various elements. It should be noted that many alternative or additional functional relationships or physical connections may be present in a practical system. However, the benefits, advantages, solutions to problems, and any elements that may cause any benefit, advantage, or solution to occur or become more pronounced are not to be construed as critical, required, or essential features or elements of the disclosure.

The scope of the disclosure is accordingly to be limited by nothing other than the appended claims, in which reference to an element in the singular is not intended to mean "one and only one" unless explicitly so stated, but rather "one or more." It is to be understood that unless specifically stated otherwise, references to "a," "an," and/or "the" may include one or more than one and that reference to an item in the singular may also include the item in the plural. All ranges and ratio limits disclosed herein may be combined.

Moreover, where a phrase similar to "at least one of A, B, and C" is used in the claims, it is intended that the phrase be interpreted to mean that A alone may be present in an embodiment, B alone may be present in an embodiment, C alone may be present in an embodiment, or that any combination of the elements A, B and C may be present in a single embodiment; for example, A and B, A and C, B and C, or A and B and C. Different cross-hatching is used throughout the figures to denote different parts but not necessarily to denote the same or different materials.

The steps recited in any of the method or process descriptions may be executed in any order and are not necessarily limited to the order presented. Furthermore, any reference to singular includes plural embodiments, and any reference to more than one component or step may include a singular embodiment or step. Elements and steps in the figures are illustrated for simplicity and clarity and have not necessarily been rendered according to any particular sequence. For example, steps that may be performed concurrently or in different order are illustrated in the figures to help to improve understanding of embodiments of the present disclosure.

Any reference to attached, fixed, connected or the like may include permanent, removable, temporary, partial, full and/or any other possible attachment option. Additionally, any reference to without contact (or similar phrases) may also include reduced contact or minimal contact. Surface shading lines may be used throughout the figures to denote different parts or areas but not necessarily to denote the same or different materials. In some cases, reference coordinates may be specific to each figure.

Systems, methods and apparatus are provided herein. In the detailed description herein, references to "one embodiment," "an embodiment," "various embodiments," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described. After reading the description, it will be apparent to one skilled in the relevant art(s) how to implement the disclosure in alternative embodiments.

Furthermore, no element, component, or method step in the present disclosure is intended to be dedicated to the public regardless of whether the element, component, or method step is explicitly recited in the claims. No claim element is intended to invoke 35 U.S.C. 112(f) unless the element is expressly recited using the phrase "means for." As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method of manufacturing a ceramic matrix composite component, the method comprising:
    introducing a gaseous precursor into an inlet portion of a chamber such that the gaseous precursor infiltrates a porous preform housed in the inlet portion of the chamber to densify the porous preform; and
    introducing a gaseous mitigation agent into an outlet portion of the chamber that is downstream of the inlet portion of the chamber such that the gaseous mitigation agent flows through a gas mixing substrate loaded within a gas mixing space defined by the outlet portion of the chamber;
    wherein the porous preform is only disposed in the inlet portion of the chamber;
    wherein the gas mixing substrate is only disposed in the outlet portion of the chamber; and
    wherein introducing the gaseous precursor and introducing the gaseous mitigation agent are performed simultaneously, with the gaseous mitigation agent only flowing through the outlet portion of the chamber and not flowing through the inlet portion of the chamber.

2. The method of claim 1, wherein the gaseous precursor comprises methyltrichlorosilane (MTS).

3. The method of claim 2, wherein the gaseous mitigation agent comprises hydrogen gas.

4. The method of claim 3, wherein introducing the gaseous precursor is performed at a first molar flow rate and introducing the gaseous mitigation agent is performed at a second molar flow rate that is greater than the first molar flow rate.

5. The method of claim 4, wherein the second molar flow rate is between 50% and 300% higher than the first molar flow rate.

6. The method of claim 4, wherein the second molar flow rate is between 100% and 200% higher than the first molar flow rate.

7. The method of claim 3, wherein the gaseous precursor also comprises hydrogen gas.

8. The method of claim 7, wherein the methyltrichlorosilane comprises about 5% of the gaseous precursor.

9. The method of claim 1, wherein the gaseous mitigation agent comprises introducing the gaseous mitigation agent into an upstream side of the outlet portion of the chamber.

\* \* \* \* \*